(12) United States Patent
Lee et al.

(10) Patent No.: US 10,768,234 B2
(45) Date of Patent: Sep. 8, 2020

(54) METHOD FOR ESTIMATING POWER CONSUMPTION OF MOTOR IN FUEL CELL SYSTEM

(71) Applicants: HYUNDAI MOTOR COMPANY, Seoul (KR); KIA MOTORS CORPORATION, Seoul (KR)

(72) Inventors: Dong Hun Lee, Anyang-si (KR); Chang Seok You, Anyang-si (KR); Min Su Kang, Paju-si (KR); Sung Do Kim, Seongnam-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 180 days.

(21) Appl. No.: 15/782,679

(22) Filed: Oct. 12, 2017

(65) Prior Publication Data

US 2018/0164380 A1 Jun. 14, 2018

(30) Foreign Application Priority Data

Dec. 13, 2016 (KR) .......................... 10-2016-0169990

(51) Int. Cl.
*G01R 31/34* (2020.01)
*B60L 58/30* (2019.01)
(Continued)

(52) U.S. Cl.
CPC .......... *G01R 31/343* (2013.01); *B60L 15/025* (2013.01); *B60L 50/72* (2019.02);
(Continued)

(58) Field of Classification Search
CPC ............ B60L 15/025; B60L 2240/423; B60L 2240/427; B60L 2240/426;
(Continued)

(56) References Cited

U.S. PATENT DOCUMENTS 7,438,984 B2 10/2008 Aoyagi et al.
2005/0197751 A1* 9/2005 Koike ............... H01M 8/04089
701/22

(Continued)

FOREIGN PATENT DOCUMENTS

JP 2001-078486 A 3/2001
JP 2004-063338 A 2/2004
(Continued)

*Primary Examiner* — Adam A Arciero
(74) *Attorney, Agent, or Firm* — Morgan, Lewis & Bockius LLP

(57) ABSTRACT

A method for estimating power consumption of a motor includes steps of: determining an error voltage for a terminal voltage of each of multiple phases of the motor, the terminal voltage being supplied from an inverter to the motor; generating a compensation terminal voltage for each of the multiple phases of the motor by applying the error voltage to a prediction value of the terminal voltage that is derived in a preset manner during operation of the motor; and calculating power consumption of the motor by using the compensation terminal voltage and a current value obtained by detecting a current that flows in each of the multiple phases of the motor.

11 Claims, 6 Drawing Sheets

(51) Int. Cl.
  *B60L 15/02* (2006.01)
  *B60L 50/72* (2019.01)
  *H01M 8/04537* (2016.01)
  *H01M 8/04992* (2016.01)
  *H02P 6/08* (2016.01)
  *H02P 31/00* (2006.01)

(52) U.S. Cl.
  CPC ......... *B60L 58/30* (2019.02); *H01M 8/04544* (2013.01); *H01M 8/04992* (2013.01); *B60L 2240/423* (2013.01); *B60L 2240/427* (2013.01); *B60L 2240/429* (2013.01); *B60L 2240/527* (2013.01); *B60L 2240/529* (2013.01); *B60L 2260/44* (2013.01); *H01M 2250/20* (2013.01); *H02P 6/08* (2013.01); *H02P 31/00* (2013.01); *Y02T 90/32* (2013.01)

(58) Field of Classification Search
  CPC ......... B60L 2240/527; B60L 2240/529; B60L 2260/44; B60L 50/72; B60L 58/30; G01R 31/343; H01M 2250/20; H01M 8/04544; H01M 8/04992; H02P 31/00; H02P 6/08; Y02T 90/32
  See application file for complete search history.

(56) References Cited

U.S. PATENT DOCUMENTS

2006/0222910 A1* 10/2006 Aoyagi .............. H01M 16/006
  429/432
2017/0263961 A1* 9/2017 Kazuno ............ H01M 8/04992

FOREIGN PATENT DOCUMENTS

| JP | 2007-282440 A | 10/2007 |
| JP | 2007-335411 A | 12/2007 |
| JP | 2011-019333 A | 1/2011 |
| JP | 2011-188633 A | 9/2011 |
| JP | 2016-096666 A | 5/2016 |
| KR | 10-0742760 B1 | 7/2007 |
| KR | 10-2014-0073735 A | 6/2014 |
| KR | 10-2015-0026265 A | 3/2015 |

* cited by examiner

METHOD FOR ESTIMATING POWER CONSUMPTION OF MOTOR IN FUEL CELL SYSTEM

CROSS REFERENCE TO RELATED APPLICATION

The present application is based on and claims the benefit of priority to Korean Patent Application No. 10-2016-0169990, filed on Dec. 13, 2016 with the Korean Intellectual Property Office, the entire contents of which are incorporated herein for all purposes by this reference.

TECHNICAL FIELD

The present disclosure relates generally to a method for estimating power consumption of a motor. More particularly, the present disclosure relates to a method for estimating power consumption of a motor, the method compensating an error that occurs when a switching element of an inverter is operated so as to derive a terminal voltage of each phase, thereby the estimating power consumption of the motor.

BACKGROUND

In a fuel cell vehicle, it is desirable to control distribution of electric power generated from a fuel cell to various components of the vehicle. When controlling the power distribution of the fuel cell vehicle, it is extremely important to estimate power of auxiliary systems such as an air compressor for supplying air to a cathode of the fuel cell by operating a motor, a pump for circulating cooling water cooling the fuel cell stack, a radiator fan, an air conditioner, etc. However, power of the fuel cell stack and of a high voltage battery may be precisely estimated by using current sensors provided at respective output ends. A motor of a driving system connected to driving wheels of a vehicle may estimate power consumption on the basis of a prediction value of torque. In contrast, other auxiliary systems for a vehicle are not provided with respective individual sensors, and thus it is impossible to precisely estimate power consumption.

Particularly, an air compressor including a motor to supply air to the fuel cell consumes approximately 10% of the total power of the fuel cell stack, and thus it is important to precisely estimate power consumption of the motor of the air compressor in order to enhance precision in power distribution control. However, it is difficult to precisely estimate power consumption. Particularly, the air compressor supplies air required for reaction with the fuel, to the fuel cell stack, and thus speed variation of the motor of the air compressor is wide depending on variation of the power of the fuel cell. Due to this, power of the motor of the air compressor varies depending on driving speed, and power consumption is different depending on acceleration, deceleration, and constant speed states at the same speed. Thus, it is extremely difficult to estimate power consumption of the motor of the air compressor.

In the fuel cell vehicle, it is desirable to precisely estimate power consumption of the above-described air compressor for tactical control of the power of the fuel cell stack and charging-discharging amount of the battery. For example, when a driver attempts to achieve wide open throttle (WOT) acceleration and the estimation in power consumption of the air compressor is incorrect, the motor consumes as much or as little energy of the fuel cell or the high voltage battery as the estimation error of the power consumption of the air compressor. When the air compressor consumes the energy more, the fuel cell or the battery consumes the energy beyond an acceptable maximum output. Thus, the fuel cell and the battery may be damaged. When the air compressor consumes the energy less, air supply to the fuel cell is insufficient. Thus, it is difficult to provide power performance required from the vehicle.

Conventionally, a map mapping power consumption onto flow rate of an air compressor or rotational speed of a motor through a test is used to estimate power consumption of the air compressor. However, in this way, as described above, power consumption of the motor of the air compressor is different depending on driving states such as acceleration, deceleration, and constant speed, and levels of acceleration and deceleration at the same rotational speed (or flow rate of air being supplied by an air compressor) condition. Thus, it is difficult to precisely estimate power consumption.

As described above, the fuel cell vehicle requires technology for accurately estimating power consumption of an air compressor supplying air to a fuel cell, more precisely, power consumption of a motor in the air compressor.

The foregoing is intended merely to aid in the understanding of the background of the present disclosure, and is not intended to mean that the present disclosure falls within the purview of the related art that is already known to those skilled in the art.

SUMMARY

The present disclosure has been made keeping in mind the above problems occurring in the related art, and the present disclosure is intended to propose a method for estimating power consumption of an air compressor in a fuel cell system, the method compensating an error that occurs when a switching element of an inverter is operated, and deriving a terminal voltage of each phase applied to a motor, thereby accurately estimating power consumption of the motor.

In order to achieve the above object, according to one aspect of the present disclosure, a method for estimating power consumption of a motor includes steps of: determining an error voltage for a terminal voltage of each of multiple phases of the motor, the terminal voltage being supplied from an inverter to the motor; generating a compensation terminal voltage for each of the multiple phases of the motor by applying the error voltage to a prediction value of the terminal voltage that is derived in a preset manner during operation of the motor; and calculating power consumption of the motor by using the compensation terminal voltage and a current value obtained by detecting a current that flows in each of the multiple phases of the motor.

According to an embodiment of the present disclosure, the step of determining an error voltage may include steps of: supplying a terminal voltage command for each of the multiple phases of the motor to the inverter; detecting the current of each of the multiple phases of the motor depending on a change in the terminal voltage command; and extending a line of a region where the current is linearly changed in a voltage-current graph showing a relationship between the terminal voltage command and the detected current, and determining a voltage value of a point where the line meets a voltage axis of the voltage-current graph to be the error voltage for each of the multiple phases.

According to an embodiment of the present disclosure, the step of supplying a terminal voltage command may include: supplying a positive terminal voltage command and a negative terminal voltage command to each of the multiple phases of the motor, and the step of determining an error voltage may further include steps of: determining a first error voltage for each of the multiple phases by using a positive current that is detected when the positive terminal voltage command is supplied; and determining a second error voltage for each of the multiple phases by using a negative current that is detected when the negative terminal voltage command is supplied.

According to an embodiment of the present disclosure, the step of generating a compensation terminal voltage may include: generating the compensation terminal voltage for each of the multiple phases by subtracting the error voltage from the prediction value of the terminal voltage when the current of each of the multiple phases is a positive value during operation of the motor, and by adding the error voltage to the prediction value of the terminal voltage when the current of each of the multiple phases is a negative value during operation of the motor.

According to an embodiment of the present disclosure, the step of generating a compensation terminal voltage may include: generating the compensation terminal voltage for each of the multiple phases by subtracting the first error voltage from the prediction value of the terminal voltage when the current of each of the multiple phases is a positive value during operation of the motor, and by subtracting the second error voltage from the prediction value of the terminal voltage when the current of each of the multiple phases is a negative value during operation of the motor.

According to an embodiment of the present disclosure, the step of generating a compensation terminal voltage may include: subtracting the error voltage from the prediction value of the terminal voltage when the current of each of the multiple phases is greater than a preset reference current $\alpha$ (positive value); adding the error voltage to the prediction value of the terminal voltage when the current of each of the multiple phases is less than $-\alpha$; and changing the error voltage linearly and applying the changed error voltage to the prediction value of the terminal voltage when the current of each of the multiple phases is a value ranging from $\alpha$ to $-\alpha$.

According to an embodiment of the present disclosure, when the current of each of the multiple phases is a value ranging from $\alpha$ to $-\alpha$, the error voltage may be changed and applied to the prediction value of the terminal voltage by using formulas $$V_{n\_Out\_real} = V_n - V_{Comp} \text{ and } V_{Comp} = V_{ref} \times \frac{I}{\alpha}$$

($V_{n\_out\_real}$: the compensation terminal voltage for each of the multiple phases, $V_n$: the prediction value of the terminal voltage for each of the multiple phases, $V_{ref}$: the error voltage, $\alpha$: the reference current, I: the detected current of each of the multiple phases).

According to an embodiment of the present disclosure, the prediction value of the terminal voltage may be a voltage value estimated based on a duty value of a PWM signal applied to a gate of a switching element of the inverter, or may be a terminal voltage command value of each of the multiple phases generated by performing coordinate transformation on both a D-axis voltage command and a Q-axis voltage command that are generated at a current controller included in a motor controller for controlling the motor.

According to an embodiment of the present disclosure, the step of calculating a power consumption may include: converting the compensation terminal voltage into D-axis and Q-axis voltages of a stationary reference frame, and converting the current value obtained by detecting the current that flows in each of the multiple phases of the motor into D-axis and Q-axis currents of the stationary reference frame; and calculating the power consumption of the motor by using the converted voltages and currents.

According to an embodiment of the present disclosure, the step of calculating a power consumption may further include: calculating the power consumption of the motor by using formula $$P_{mot} = 1.5 \times (I_{Dfix} \times V_{D\_Out\_real} + I_{Qfix} \times V_{Q\_Out\_real})$$

($I_{Dfix}$: the D-axis current of the stationary reference frame generated by converting the current value, $I_{Qfix}$: the Q-axis current of the stationary reference frame generated by converting the current value, $V_{D\_out\_real}$: the D-axis voltage of the stationary reference frame generated by converting the compensation terminal voltage, $V_{Q\_out\_real}$: the Q-axis voltage of the stationary reference frame generated by converting the compensation terminal voltage).

According to an embodiment of the present disclosure, the method may further include a step of: calculating power of the inverter based on both the calculated power consumption of the motor obtained in the calculating of the power consumption and inverter efficiency preset for the inverter.

According to an embodiment of the present disclosure, the step of calculating power of the inverter may include: calculating the power of the inverter by using formula $$P_{inv} = P_{mot} \times \eta_{inv}$$

($P_{inv}$: the power of the inverter, $P_{mot}$: the calculated power consumption of the motor obtained in the calculating of the power consumption, $\eta_{inv}$: the inverter efficiency) in a motoring state where the inverter applies torque in a rotation direction of the motor, and calculating the power of the inverter by using formula $$P_{inv} = \frac{P_{mot}}{\eta_{inv}}$$

in a regenerative braking state where the inverter applies torque in a direction opposite to the rotation direction of the motor.

According to the method for estimating power consumption of the motor, it is possible to enhance precision in both power distribution control of a fuel cell vehicle and fuel cell output restriction by accurately estimating the power consumption of the motor applied to the air compressor of the fuel cell vehicle.

In addition, according to the method for estimating power consumption of the motor, through the improvement in precision of the fuel cell output restriction, it is possible to prevent permanent damage to a fuel cell caused by excessive output from the fuel cell, whereby it is possible to enhance vehicle driving stability through the fuel cell output restriction.

In addition, according to the method for estimating power consumption of the motor, it is possible to accurately estimate power consumption of the air compressor for the fuel cell vehicle without a DC current sensor, and to secure response and precision levels at the same levels as when a DC current sensor is provided.

BRIEF DESCRIPTION OF THE DRAWINGS

The above and other objects, features and other advantages of the present disclosure will be more clearly understood from the following detailed description when taken in conjunction with the accompanying drawings, in which.

DETAILED DESCRIPTION

Hereinbelow, a method for estimating power consumption of an air compressor in a fuel cell system according to exemplary embodiments of the present disclosure will be described in detail with reference to the accompanying drawings.

Figure 1:
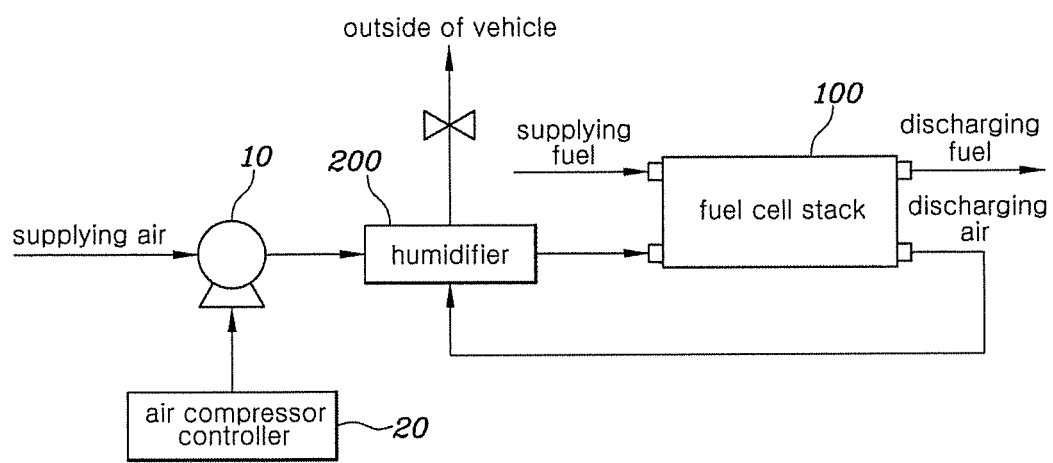
FIG. 1 is a block diagram briefly showing an example of a fuel cell system to which a method for estimating power consumption of a motor may be applied according to an embodiment of the present disclosure.

FIG. 1 is a block diagram briefly showing an example of a fuel cell system to which a method for estimating power consumption of a motor may be applied according to an embodiment of the present disclosure.

As shown in FIG. 1, the fuel cell system may include: a fuel cell stack 100 including fuel cells that generate power through oxidation-reduction by receiving hydrogen and air, which are respectively the fuel and the oxidizing agent; and an air compressor 10 supplying compressed air to a cathode of the fuel cell stack 100; and a humidifier 200 supplying moisture to the compressed air of the air compressor 10 and providing it to the fuel cell stack 100. Here, the humidifier 200 receives highly humid non-reactive air, discharged from the fuel cell stack 100, and supplies moisture to air being supplied to the fuel cell stack 100.

In order to control the air compressor 10, the fuel cell system may include a controller 20 for controlling the air compressor 10, more specifically, for controlling a motor included in the air compressor 10. The controller 20 may include a general motor controller 21 for controlling the motor of the air compressor 10 according to a speed command or a torque command. According to embodiments of the present disclosure, elements for realizing a method for estimating power consumption of a motor may be provided in the controller 20. Alternatively, apart from the controller 20, an additional controller or a calculator for realizing a method for estimating power consumption of a motor may be provided.

The controller 20 or the general motor controller 21 is an electric circuitry that executes instructions of software which thereby performs various functions described hereinafter.

In addition, embodiments of the present disclosure are examples to which the method for estimating power consumption of the motor of the air compressor 10 in the fuel cell system is applied. However, descriptions of the examples do not limit the present disclosure to an air compressor of a fuel cell system. Thus, besides fuel cell fields, the present disclosure may be applied to various methods for estimating power consumption of a motor that are applied to other technical fields.

Figure 2:
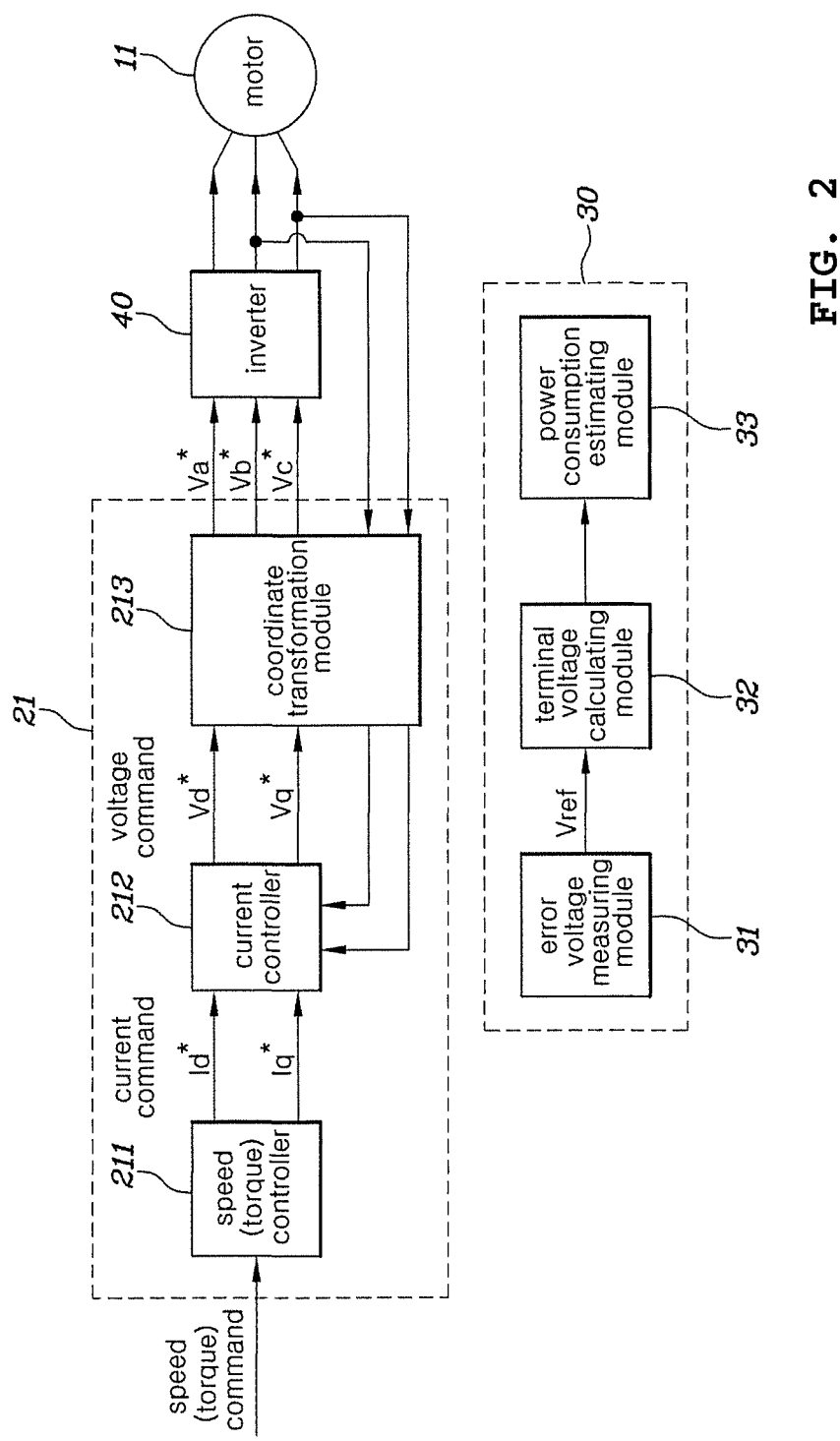
FIG. 2 is a block diagram showing a system to which a method for estimating power consumption of a motor is applied according to an embodiment of the present disclosure.

FIG. 2 is a block diagram showing a motor power consumption estimation system according to an embodiment of the present disclosure.

Referring to FIG. 2, according to the embodiment of the present disclosure, the motor power consumption estimation system 30 may include: an error voltage measuring module 31; a terminal voltage calculating module 32; and a power consumption estimating module 33.

A processor performs various functions of the following modules 31, 32 and 33. The modules 31, 32 and 33 described below are implemented with software instructions executed on the processor.

According to the embodiment of the present disclosure, the motor power consumption estimation system 30 estimates power consumption of a motor 11 by using values generated at the general motor controller 21 controlling a motor, an output current value of an inverter 40 generating three-phase terminal voltages provided to a motor 11, etc.

According to the embodiment of the present disclosure, the motor power consumption estimation system including the error voltage measuring module 31, the terminal voltage calculating module 32, and the power consumption estimating module 33 may be provided as a controller as described above. The controller may include both a processor performing operations for realizing pre-programmed algorithms, and a memory for storing various kinds of information required for operation processes. In addition, as described above, according to the embodiment of the present disclosure, the controller for realizing the motor power consumption estimation system 30 may be provided as hardware integrated with the general motor controller for controlling the motor 11, or may be provided independently.

The error voltage measuring module 31 measures an error voltage for compensating a prediction value, which is derived in a preset manner, of a terminal voltage for each phase of an inverter.

The terminal voltage calculating module 32 calculates a compensation terminal voltage by applying the error voltage.

In addition, the power consumption estimating module 33 calculates power consumption of the motor by using the compensation terminal voltage.

In the meantime, the general motor controller designated as reference numeral '21' in FIG. 2 may include: a speed (torque) controller 211; a current controller 212; and a coordinate transformation module 213.

The speed (torque) controller 211 receives a speed command or a torque command for controlling speed or torque of the motor from a higher level controller (not shown) so as to generate and output current command values (Id*, Iq*). Here, the higher level controller may be a controller for controlling the fuel cell system, or may be a vehicle controller for controlling a vehicle to which the fuel cell system is applied. The higher level controller may determine power of the fuel cell stack 100 on the basis of speed and hill climbing angle of a vehicle, an opening rate of an accelerator operated by a driver, etc. In addition, the higher level controller may determine rotational speed or torque of the motor of the air compressor 10 on the basis of output and temperature, etc. of the fuel cell stack 100. The higher level controller provides the determined rotational speed or torque of the motor as a speed command value or a torque command value to the speed (torque) controller 211. The speed (torque) controller 211 compares the received speed command value or torque command value with an actual rotational speed of the motor so as to generate and output the current command values (Id*, Iq*) for estimating a speed command value by using the rotational speed of the motor.

Here, the current command values (Id*, Iq*) are command values for a driving current of the motor 11. Torque of the motor 11 is determined on the basis of the level of the driving current being supplied to the motor 11. Thus, torque of the motor 11 may be considered equal to the driving current of the motor 11. More specifically, the current command values (Id*, Iq*) being output from the speed (torque) controller 211 may be D-axis and Q-axis current command values (Id*, Iq*) in a synchronous reference frame of the motor.

Similar to a general proportional integral (PI) controller, the speed (torque) controller 211 may use a control technique for integrating errors between command values and measured values through the operation of integration and applying the result to control levels. That is, the speed (torque) controller 211 may use a control technique for integrating errors between a speed command or a torque command and the actual speed or torque of the motor 11 and applying the result. Besides the PI control technique, the speed (torque) controller 211 may use a proportional integral differential (PID) control technique, an integral proportional (IP) control technique, an IP-PI combination control technique, etc.

The current controller 212 controls currents being supplied from the inverter 40 to the motor 11 according to current command values (Id*, Iq*), and outputs D-axis and Q-axis voltage command values (Vd*, Vq*) of a synchronous reference frame. The current controller 212 receives feedback about actual currents that are D-axis and Q-axis currents obtained by detecting and converting a part or all of currents of each phase being supplied from the inverter 40. Next, the current controller 212 controls the actual currents according to current command values, namely, D-axis and Q-axis current command values (Id*, Iq*).

Similar to the speed controller 211, the current controller 212 may use a control technique including the operation of integration for integrating errors between the current command values (Id*, Iq*) and actual currents being supplied from the inverter 40 to the motor such as the PI control technique, the PID control technique, the IP control technique, the IP-PI combination control technique, etc.

The coordinate transformation module 213 converts the D-axis and Q-axis voltage command values (Vd*, Vq*) into voltage command values of three phases through coordinate transformation (DQ↔three phases (abc)). The coordinate transformation module may generate a PWM switching signal for driving a switching element in the inverter 40 through pulse width modulation based on the voltage command values of three phases, and may provide the PWM switching signal to the inverter 40. The PWM switching signal is applied to a gate of a switching element in the inverter 40, and thus switching elements are controlled, whereby the inverter 40 outputs three-phase current for driving the motor 11.

In the meantime, the coordinate transformation module 213 may convert the measured values of the three-phase driving currents of the inverter 40 that are feedback for the control of the current controller 212, into DQ currents so as to provide the DQ currents to the current controller 212.

That is, in order to generate a terminal voltage being applied to a motor, the coordinate transformation module 213 may convert D-axis and Q-axis voltage command values of a synchronous reference frame into D-axis and Q-axis voltages of a stationary reference frame, and may convert the D-axis and Q-axis voltages into three-phase (a-phase, b-phase, c-phase) voltages. Also, the coordinate transformation module may convert three-phase currents detected for feedback control into currents of a stationary reference frame, and may convert the currents into current of a synchronous reference frame. Here, detailed methods of the coordinate transformation are well known in the art, and thus descriptions thereof will be omitted to prevent confusion in a main technical spirit of the present disclosure.

Hereinafter, a method, which is realized by the motor power consumption estimation system according to an embodiment of the present disclosure, for estimating power consumption of a motor will be described in detail. Through the description of the method for estimating power consumption of a motor according to an embodiment of the present disclosure, operation and effect of the motor power consumption estimation system will be clearly understood.

Figure 3:
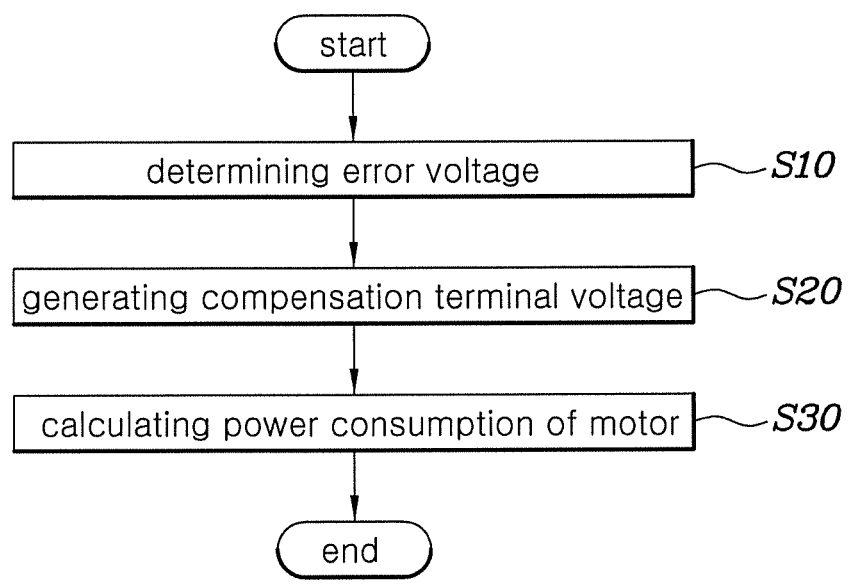
FIG. 3 is a flowchart showing a method for estimating power consumption of a motor according to an embodiment of the present disclosure.

FIG. 3 is a flowchart showing a method for estimating power consumption of a motor according to an embodiment of the present disclosure.

As shown in FIG. 3, according to an embodiment of the present disclosure, the method for estimating power consumption of a motor includes: determining an error voltage at step S10; generating a compensation terminal voltage by applying the error voltage at step S20; and calculating power consumption of the motor by using the compensation terminal voltage at step S30.

First, when determining the error voltage at step S10, the error voltage measuring module 31 measures the error voltage included in a prediction value of a terminal voltage so as to calculate an actual terminal voltage of each phase being output from the inverter 40 to the motor 11.

Generally, power consumption of a motor may be calculated by using the following formula 1.

$$P_{mot} = 1.5 \times (I_{Dfix} \times V_{Dfix} + I_{Qfix} \times V_{Qfix})$$ [formula 1]

In formula 1, power consumption of a motor is designated as Pmot, a D-axis of a motor stationary reference frame is designated as subscript Dfix, and a Q-axis of a motor stationary reference frame is designated as subscript Qfix. Therefore, a D-axis current being supplied to a motor is designated as $I_{Dfix}$, a D-axis voltage being supplied to a motor is designated as $V_{Dfix}$, a Q-axis current being supplied to a motor is designated as $I_{Qfix}$, and a Q-axis voltage being supplied to a motor is designated as $V_{Qfix}$.

Generally, a current of each phase being output from the inverter 40 to the motor 11 is detected by a current sensor. For example, at least two of a-, b-, and c-phase currents being output from the inverter 40 to the motor 11 are detected by a current sensor (not shown) for current control. Therefore, currents in formula 1 may be derived as reliable values by performing coordinate transformation on detected current values of phases. However, voltages in formula 1 for conventional motor power consumption estimation are not based on values derived through an individual sensor, etc. However, the voltages may be voltage values estimated based on a duty value of a pulse width modulation (PWM) signal applied to a gate of a switching element of the inverter 40, which is realized as a full bridge circuit for applying an alternating voltage to three phases of a motor on the basis of an input voltage, or based on three-phases terminal voltage commands generated by performing coordinate transformation on both a D-axis voltage command and a Q-axis voltage command that are generated at the current controller 212 included in the motor controller 21.

As described above, there is an error between estimated three-phase terminal voltages by a conventional technique and actual three-phase terminal voltages applied to the motor, and thus there is an error in the estimated value of power consumption of a motor that is calculated by using formula 1. For example, a calculated power consumption value of a motor is desirable to be lower than an inverter output value because inverter efficiency is less than 100%. However, sometimes the calculated power consumption value is larger than the inverter output.

Figure 4:
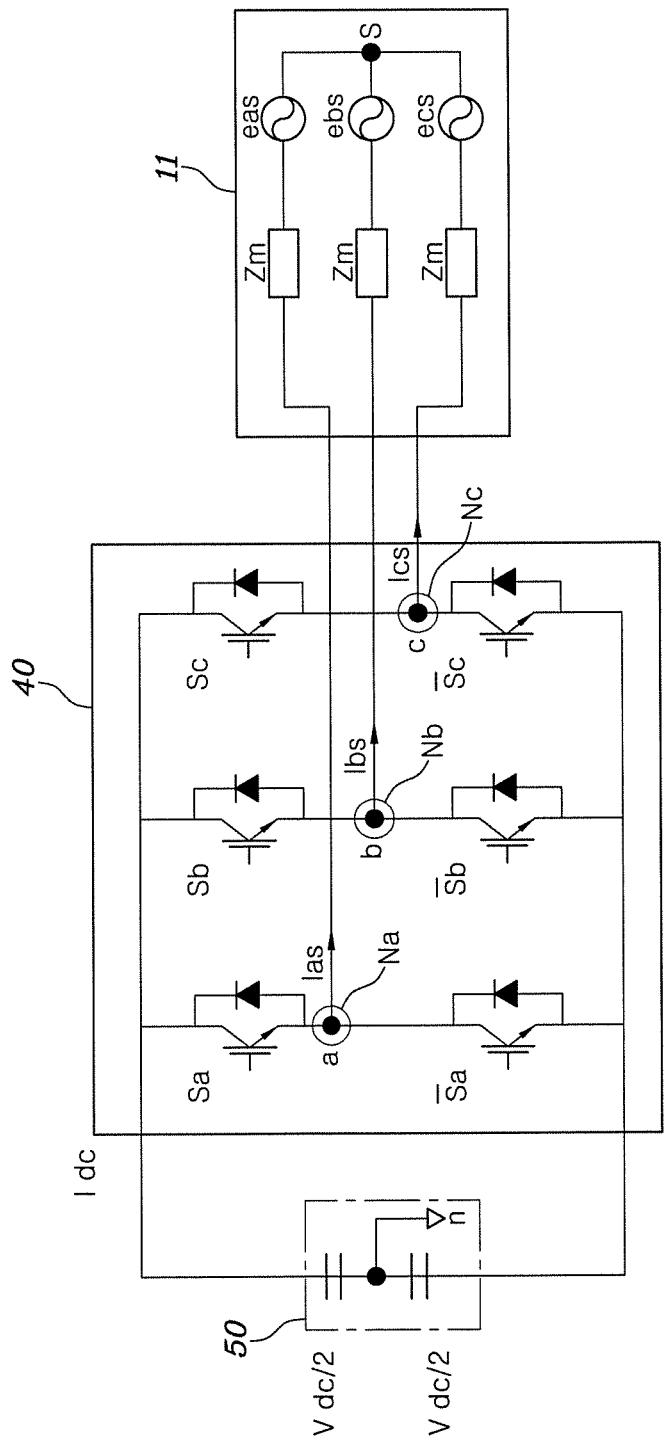
FIG. 4 is a circuit diagram showing a general inverter and motor to assist in understanding a method for estimating power consumption of a motor according to an embodiment of the present disclosure.

FIG. 4 is a circuit diagram showing a general inverter and motor to assist in understanding a method for estimating power consumption of a motor according to an embodiment of the present disclosure.

As shown in FIG. 4, the inverter 40 may have a full bridge circuit where two switching elements are connected to each other in series as a pair, and three pairs are connected to opposite ends of a battery 50 in parallel. Each pair of switching elements applies one phase voltage and current to the motor 11. A terminal voltage of each phase is a voltage of each of connection nodes (Na, Nb, Nc) of one pair of switching elements that perform output from the inverter to each phase in FIG. 4.

For example, a switching element Sa and a switching element Sa^bar apply a-phase power to the motor 11. When the switching element Sa is on and the switching element Sa^bar is off, a-phase voltage and current being supplied to the motor 11 is a positive value. In contrast, when the switching element Sa is off and the switching element Sa^bar is on, a-phase voltage and current being supplied to the motor 11 is a negative value. Consequently, an a-phase alternating voltage is applied to the motor. Other phase alternating voltages are generated and applied to the motor in the same manner as described above.

In order to drive a motor with desired speed and torque, the motor controller 21 of FIG. 2 calculates a terminal voltage command being supplied to each phase, determines a duty value of a gate signal being supplied to gates of switching elements included in the inverter 40, and applies the duty value to a gate of the inverter so as to apply the calculated terminal voltage command to the motor.

In order to precisely estimate power consumption of the motor 11, it is desirable to precisely obtain an actual value of a terminal voltage for each phase of the inverter 40. However, as described above, a prediction value of a terminal voltage is used in conventional motor power consumption estimation rather than an actual value of a terminal voltage. Thus, accuracy in motor power consumption estimation decreases due to an error between the actual value of a terminal voltage and the prediction value of a terminal voltage.

Major causes of errors between prediction values of three-phase terminal voltages and actual values of three-phase terminal voltages include: voltage drop caused by conduction loss between a collector and an emitter of a switch element included in an inverter, and a voltage error caused by dead time effect between turn-on times of two switching elements. The dead time effect is used to avoid a short circuit that occurs when two switching elements (upper phase and lower phase), which are connected to each other in series to generate one-phase voltage, are simultaneously turned on.

Generally, the current controller 212 of the controller 21 for controlling the motor uses an algorithm of theoretically compensating the dead time effect of switching elements when calculating three-phase output PWM duty based on three-phase terminal voltage commands. However, there is an error between a voltage compensation value calculated through the algorithm and an actual voltage value. The level of the error varies depending on a kind and characteristics of a switching element that is used, and on a voltage compensation control algorithm that is applied.

Therefore, when determining the error voltage at step S20 in the method of estimating power consumption of a motor according to an embodiment of the present disclosure, the error voltage measuring module 31 measures the error voltage to compensate the error of the terminal voltage.

Figure 5:
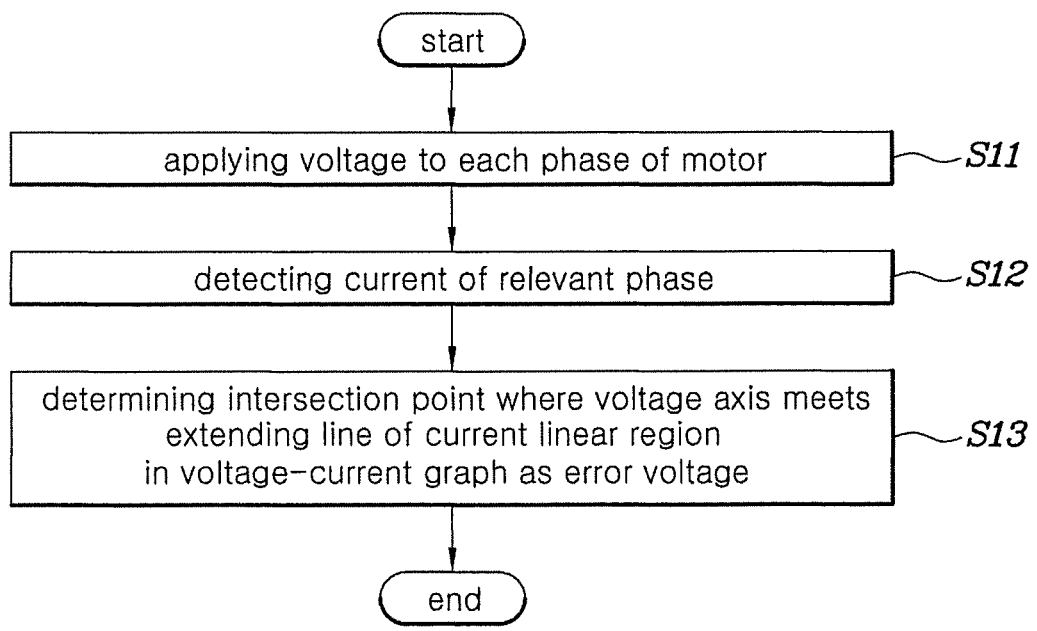
FIG. 5 is a flowchart showing in detail the determining of an error voltage in a method for estimating power consumption of a motor according to an embodiment of the present disclosure.

FIG. 5 is a flowchart showing the determining of the error voltage in a method for estimating power consumption of a motor in detail according to an embodiment of the present disclosure.

First, the error voltage measuring module 31 enables the motor controller 21 to output a terminal voltage command, which increases or decreases consistently, to one of multiple phases of the motor 11 at step S11, and measures the current of the phase to detect current change depending on voltage change as shown in FIG. 5 at step S12. Next, the error voltage measuring module 31 makes a graph showing a relationship between a terminal voltage command and a current depending on the terminal voltage command, extends a line of a region where the current is linearly changed depending on a change in a voltage, and determines a voltage value of a point where the line meets a voltage axis of the voltage-current graph as the error voltage Vref at step S13. The voltage-current graph used at step S13 is shown in FIG. 6.

Figure 6:
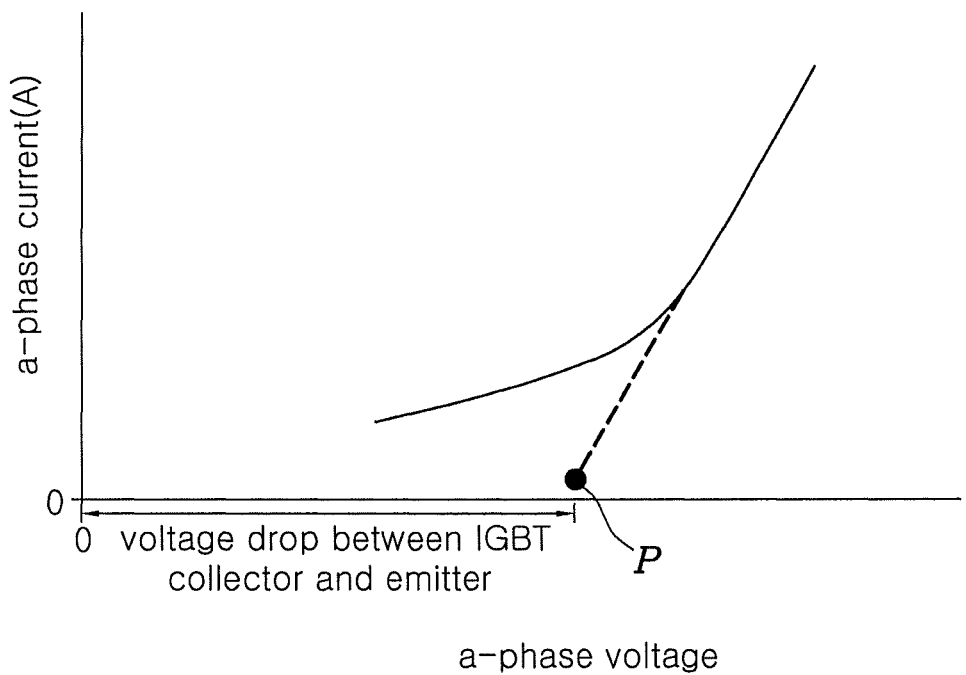
FIG. 6 is a voltage-current relationship graph that is derived when determining an error voltage in a method for estimating power consumption of the motor according to an embodiment of the present disclosure.

FIG. 6 is a voltage-current relationship graph that is derived when determining an error voltage in a method for estimating power consumption of the motor according to an embodiment of the present disclosure. The determining of the error voltage at step S11 includes: extending a line of a region where a current is linearly changed depending on a change in a voltage, and determining a voltage value of a point where the line meets a voltage axis of the voltage-current graph as the error voltage Vref.

A winding resistance of a stator of the motor 11 is a constant, and thus a current flowing depending on an applied voltage increases linearly. Therefore, the voltage value of a point where a voltage axis of the voltage-current graph meets a line extending from the line of the region where the current is linearly changed depending on the change in the voltage, may be a value for the voltage drop between the collector and the emitter of the switching element. The voltage value may be used as the error voltage between a prediction value of a three-phase terminal voltage and an actual voltage applied to the motor. The error voltage Vref may be derived for each phase.

Next, when generating the compensation terminal voltage at step S20, the terminal voltage calculating module 32 calculates a compensation terminal voltage in which the error voltage Vref is compensated by applying the error voltage Vref to a prediction value of a terminal voltage. The prediction value of the terminal voltage may be a voltage value estimated based on a duty value of a pulse width modulation (PWM) signal applied to a gate of a switching element of the inverter 40, or is a three-phase terminal voltage command generated by performing coordinate transformation on both a D-axis voltage command and a Q-axis voltage command that are generated at the current controller 212 included in the motor controller 21.

When calculating the compensation terminal voltage at step S20, the terminal voltage calculating module 32 may apply the error voltage Vref in a different way depending on whether the current of each phase is a positive value or a negative value during the operation of the motor 11.

For example, when the a-phase current is a positive value during the operation of the motor, an actual value of the terminal voltage of the a-phase (compensation terminal voltage value) may be derived by subtracting the error voltage Vref from a prediction value of the terminal voltage as shown in formula 2.

$$V_{An\_Out\_real} = V_{An} - V_{ref} \quad \text{[formula 2]}$$

In formula 2, a compensation terminal voltage of the a-phase is designated as $V_{An\_out\_real}$, and a prediction value of a terminal voltage of the a-phase is designated as $V_{An}$.

In addition, during the operation of the motor, when the a-phase current of the motor is a negative value, the a-phase terminal voltage value (compensation voltage value) may be derived by adding the error voltage Vref to the prediction value of the terminal voltage as shown in formula 3.

$$V_{An\_Out\_real} = V_{An} + V_{ref} \quad \text{[formula 3]}$$

Formulas 2 and 3 use a method of deriving an error voltage Vref by applying a positive value to a terminal voltage command in order to enable the inverter to output a phase current to each phase of the motor in a positive direction. However, the error of the terminal voltage may vary depending on the direction of the phase current. Thus, in order to enable the inverter to output a phase current to each phase of the motor in a negative direction, a negative terminal voltage command is supplied to the inverter, and the relevant phase current is measured. By identifying a voltage value of a point where a voltage axis meets a line extending from the line of the region where the current is linearly changed depending on the change in the voltage, a voltage error compensation value when a negative current flows is calculated and applied.

In contrast, when the a-phase current applies a compensation value by adding or subtracting the error voltage Vref on the basis of 0 A (zero ampere), non-linearity may occur. In order to remove the nonlinear characteristics, the terminal voltage calculating module 32 subtracts the error voltage Vref when the a-phase current is greater than a preset reference current α (positive value), and adds the error voltage Vref when the a-phase current is less than −α. When the a-phase current is a value ranging from α to −α, it is desirable to change the error voltage linearly and apply the changed error voltage as shown in the following formula 4.

$$V_{An\_Out\_real} = V_{An} - V_{Comp} \quad \text{[formula 4]}$$
$$V_{Comp} = V_{ref} \times \frac{I_A}{\alpha}$$

Here, the reference current α may be experimentally set as a value lower than a three-phase maximum current of the motor. The reference current α may be set by using various methods. For example, α is tuned by comparing a motor output value measured by an individual sensor with power consumption of a motor that is calculated by applying the error voltage Vref through formulas 2 and 3 in a low power driving are of a motor while changing the reference current α so as to minimize the error. Alternatively, the reference current α may be set by minimizing a noise of power consumption of a motor that is calculated by applying the error voltage Vref through formulas 2 and 3, wherein the noise is caused by non-linearity that occurs when the three-phase current is around zero A.

When generating the compensation terminal voltage at step S20, the terminal voltage calculating module 32 may generate the compensation terminal voltage through formulas 2 to 4 for each phase, and may derive a D-axis voltage and a Q-axis voltage in a stationary reference frame by performing coordinate transformation on the compensation terminal voltage as shown in the following formula 5.

$$\begin{bmatrix} V_{D\_Out\_real} \\ V_{Q\_Out\_real} \end{bmatrix} = \begin{bmatrix} \frac{2}{3} & -\frac{1}{3} & -\frac{1}{3} \\ 0 & \frac{1}{\sqrt{3}} & -\frac{1}{\sqrt{3}} \end{bmatrix} \begin{bmatrix} V_{An\_Out\_real} \\ V_{Bn\_Out\_real} \\ V_{Cn\_Out\_real} \end{bmatrix} \quad \text{[formula 5]}$$

Next, when calculating power consumption at step S30, the power consumption estimating module 33 calculates the power consumption of the motor 11 by using the compensation terminal voltage in which the error voltage Vref is compensated as shown in formula 6.

$$P_{mot} = 1.5 \times (I_{Dfix} \times V_{D\_Out\_real} + I_{Qfix} \times V_{Q\_Out\_real}) \quad \text{[formula 6]}$$

When using the method for estimating power consumption of the motor according to the embodiments of the present disclosure, it is possible to calculate power consumption (output) of the inverter 40 that outputs power to the motor 11.

The power consumption of the inverter 40 may be derived in a motoring state where the inverter 40 applies torque in a rotation direction of the motor as shown in formula 7, and may be derived in a regenerative braking state the inverter 40 applies torque in a direction opposite to the rotation direction of the motor as shown in formula 8.

$$P_{inv} = P_{mot} \times \eta_{inv} \quad \text{[formula 7]}$$

$$P_{inv} = \frac{P_{mot}}{\eta_{inv}} \quad \text{[formula 8]}$$

In formulas 7 and 8, power consumption (output) of the inverter is designated as $P_{inv}$, power consumption of a motor calculated by using formula 6 is designated as $P_{mot}$, and inverter efficiency is designated as $\eta_{inv}$.

The inverter efficiency may be derived in advance by using various methods. For example, it is possible to use map data experimentally calculated depending on driving conditions (rotational speed and torque value of a motor).

According to the above-described embodiments of the method for estimating power consumption of the motor, it is possible to enhance precision in both power distribution control of a fuel cell vehicle and fuel cell output restriction by accurately estimating the power consumption of the motor applied to the air compressor of the fuel cell vehicle.

In addition, according to the method for estimating power consumption of the motor, through the improvement in precision of the fuel cell output restriction, it is possible to prevent permanent damage to a fuel cell caused by excessive output from the fuel cell, whereby it is possible to enhance vehicle driving stability through the fuel cell output restriction.

In addition, according to the method for estimating power consumption of the motor, it is possible to accurately estimate power consumption of the air compressor for the fuel cell vehicle without a DC current sensor, and to secure response and precision levels the same levels when the sensor is provided.

Although a preferred embodiment of the present disclosure has been described for illustrative purposes, those skilled in the art will appreciate that various modifications, additions and substitutions are possible, without departing from the scope and spirit of the invention as disclosed in the accompanying claims.

What is claimed is:

1. A method for estimating power consumption of a motor in a fuel cell system, the method comprising steps of:
    supplying, by a controller, a terminal voltage command for each of multiple phases of the motor to an inverter;
    driving, by the controller, switching elements included in the inverter based on the terminal voltage command;
    detecting, by a current sensor, a current of each of the multiple phases of the motor depending on a change in the terminal voltage command;
    extending, by the controller, a line of a region where the current is linearly changed in a voltage-current graph showing a relationship between the terminal voltage command and the detected current, and determining, by the controller, a voltage value of a point where the line meets a voltage axis of the voltage-current graph to be an error voltage for each of the multiple phases;
    generating, by the controller, a compensation terminal voltage for each of the multiple phases of the motor by applying the error voltage to a prediction value of the terminal voltage that is derived in a preset manner during operation of the motor;
    calculating, by the controller, power consumption of the motor by using the compensation terminal voltage and a current value obtained by detecting a current that flows in each of the multiple phases of the motor; and
    controlling, by the controller, power output from the fuel cell system to be restricted based on the calculated power consumption of the motor.

2. The method of claim 1, wherein:
    the step of supplying a terminal voltage command comprises: supplying a positive terminal voltage command and a negative terminal voltage command to each of the multiple phases of the motor, and
    the step of determining an error voltage further comprises steps of: determining a first error voltage for each of the multiple phases by using a positive current that is detected when the positive terminal voltage command is supplied; and determining a second error voltage for each of the multiple phases by using a negative current that is detected when the negative terminal voltage command is supplied.

3. The method of claim 1, wherein the step of generating a compensation terminal voltage comprises:
    generating the compensation terminal voltage for each of the multiple phases by subtracting the error voltage from the prediction value of the terminal voltage when the current of each of the multiple phases is a positive value during operation of the motor, and by adding the error voltage to the prediction value of the terminal voltage when the current of each of the multiple phases is a negative value during operation of the motor.

4. The method of claim 3, wherein the step of generating a compensation terminal voltage comprises:
    generating the compensation terminal voltage for each of the multiple phases by subtracting the first error voltage from the prediction value of the terminal voltage when the current of each of the multiple phases is a positive value during operation of the motor, and by subtracting the second error voltage from the prediction value of the terminal voltage when the current of each of the multiple phases is a negative value during operation of the motor.

5. The method of claim 1, wherein the step of generating a compensation terminal voltage comprises:
    subtracting the error voltage from the prediction value of the terminal voltage when the current of each of the multiple phases is greater than a preset reference current $\alpha$ (positive value);
    adding the error voltage to the prediction value of the terminal voltage when the current of each of the multiple phases is less than a; and
    changing the error voltage linearly and applying the changed error voltage to the prediction value of the terminal voltage when the current of each of the multiple phases is a value ranging from $\alpha$ to $-\alpha$.

6. The method of claim 5, wherein when the current of each of the multiple phases is a value ranging from $\alpha$ to $-\alpha$, the error voltage is changed and applied to the prediction value of the terminal voltage by using formulas $$V_{n\_Out\_real} = V_n - V_{Comp} \text{ and } V_{Comp} = V_{ref} \times \frac{I}{\alpha}$$

(Vn_out_real: the compensation terminal voltage for each of the multiple phases, Vn: the prediction value of the terminal voltage for each of the multiple phases, Vref: the error voltage, $\alpha$: the reference current, I: the detected current of each of the multiple phases).

7. The method of claim 1, wherein the prediction value of the terminal voltage is a voltage value estimated based on a duty value of a PWM signal applied to a gate of a switching element of the inverter, or is a terminal voltage command value of each of the multiple phases generated by performing coordinate transformation on both a D-axis voltage command and a Q-axis voltage command that are generated at a current controller included in a motor controller for controlling the motor.

8. The method of claim 1, wherein the step of calculating power consumption comprises:
    converting the compensation terminal voltage into D-axis and Q-axis voltages of a stationary reference frame, and converting the current value obtained by detecting the current that flows in each of the multiple phases of the motor into D-axis and Q-axis currents of the stationary reference frame; and calculating the power consumption of the motor by using the converted voltages and currents.

9. The method of claim 8, wherein the step of calculating power consumption further comprises:
    calculating the power consumption of the motor by using formula $P_{mot}=1.5\times(I_{Dfix}\times V_{Dfix}+I_{Qfix}\times V_{Qfix})$ (IDfix: the D-axis current of the stationary reference frame generated by converting the current value, IQfix: the Q-axis current of the stationary reference frame generated by converting the current value, VD_out_real: the D-axis voltage of the stationary reference frame generated by converting the compensation terminal voltage, VQ_out_real: the Q-axis voltage of the stationary reference frame generated by converting the compensation terminal voltage).

10. The method of claim 1, further comprising a step of:
calculating power of the inverter based on both the calculated power consumption of the motor obtained in the calculating of the power consumption and inverter efficiency preset for the inverter.

11. The method of claim 10, wherein the step of calculating power of the inverter comprises:
calculating the power of the inverter by using formula $P_{inv}=P_{mot}\times\eta_{inv}$ (Piny: the power of the inverter, Pmot: the calculated power consumption of the motor obtained in the calculating of the power consumption, ηinv: the inverter efficiency) in a motoring state where the inverter applies a torque in a rotation direction of the motor, and calculating the power of the inverter by using formula $$P_{inv} = \frac{P_{mot}}{\eta_{inv}}$$

in a regenerative braking state where the inverter applies a torque in a direction opposite to the rotation direction of the motor.

* * * * *